United States Patent [19]
Bauer et al.

[11] Patent Number: 6,124,545
[45] Date of Patent: Sep. 26, 2000

[54] THIN FILM SOLAR CELL

[75] Inventors: Stefan Bauer, Pfefelbach; Wolfgang Herbst, Konstanz-Egg; Bernd Schroeder, Kaiserlautern, all of Germany

[73] Assignee: Angewandte Solarenergie-ASE GmbH, Alzenau, Germany

[21] Appl. No.: 09/070,344

[22] Filed: Apr. 30, 1998

[30] Foreign Application Priority Data

Mar. 31, 1998 [EP] European Pat. Off. ............ 98 105 897

[51] Int. Cl.$^7$ ............................................. H01L 31/00
[52] U.S. Cl. ............................................. 136/255
[58] Field of Search ................................. 136/255

[56] References Cited

U.S. PATENT DOCUMENTS

| | | | |
|---|---|---|---|
| 4,237,150 | 12/1980 | Wiesmann .................. | 427/74 |
| 4,237,151 | 12/1980 | Strongin et al. ............ | 427/74 |
| 5,397,797 | 3/1995 | Mahan et al. .............. | 437/101 |
| 5,439,533 | 8/1995 | Saito et al. ................ | 136/255 |

OTHER PUBLICATIONS

S. Bauer, et al "An Approach Towards High Efficiency Hot–Wire CVD Based A–SI:H PIN Solar Cells", *PVSEC*, Jun. 30, 1997 (4 pages).

S. Bauer, et al "A–SI:H Solar Cells Using the Hot–Wire Technique—How To Exceed Efficiencies of 10%", Presented at *26th IEEE Photovoltaic Specialists Conference*, Sep. 29, 1997 (4 pages).

E. Molenbroek, et al "Mechanisms Influencing 'hot–wire' Deposition of Hydrogenated Amorphous Silicon", *Journal of Applied Physics*, Aug. 15, 1997 (pp. 1909–1917).

R.W. Collins, "Ellipsometric Study of a–SI:H Nucleation, Growth, and Interfaces", *World Scientific*, 1988 (pp. 1003–1044).

H. Gnaser, "Improved Quantification in Secondary–ion Mass Spectrometry Detecting MC+ Molecular Ions", *Journal Vac. Sci. Technol.*, Mar./Apr., 1994 (pp. 452–456).

R.R. Arya, et al, "Status, Progress and Challenges in High Performance, Stable Amorphous Silicon Alloy Based Triple Junction Modules", *Presented at 23rd IEEE Photovoltaic Specialists Conference*, 1993 (pp. 790–794).

MV Systems Inc., "Hot Wire CVD System", 1997 (2 pages).

S. Bauer, et al "p–i interface engineering and i–layer control of hot–wire a–Si:H based p–i–n solar cells using in–situ ellipsometry", Presented at 26th IEEE Photovoltaic Specialists Conference, Oct., 1997 (pp. 414–424).

A.R. Middya, et al Fast Deposition of Polycrystalline Silicon Films by Hot–Wire CVD, Amorphous Silicon Technology, San Francisco, Apr., 1995 (pp. 119–124).

*Primary Examiner*—Mark Chapman
*Attorney, Agent, or Firm*—Flynn, Thiel, Boutell & Tanis, P.C.

[57] ABSTRACT

In a thin-film solar cell having at least a p-type layer, an intrinsic layer of amorphous silicon and an n-type layer (p-i-n structure), the intrinsic layer has on the interface with the p-type layer an intrinsic interlayer with lower hydrogen content and greater density than the remaining intrinsic layer. The intrinsic layer is deposited on the p-type layer thermocatalytically by the hot wire method, the temperature of the filament being adjusted for controlling the layer properties, and the temperature of the substrate being less than 300° C. The hot wire method can be conducted with an evacuable chamber in which a tantalum wire subjected to at least one weight is mounted in a meander shape at a distance from the substrate holder.

7 Claims, 3 Drawing Sheets

THIN FILM SOLAR CELL

FIELD OF THE INVENTION

This invention relates to a thin-film solar cell having at least a p-type layer, an intrinsic layer of hydrogenated amorphous silicon (a-Si:H for short) deposited thereon and an n-type layer (p-i-n structure), and to a method for producing such a solar cell whereby the intrinsic layer is deposited using a heated wire which is fed a silicon hydride gas, preferably silane (thermocatalysis). This invention also relates to an apparatus for carrying out said method.

BACKGROUND OF THE INVENTION

For producing photovoltaic solar cells a-Si:H is a useful alternative to crystal-line silicon for reasons of economy and because of the high flexibility in production. For depositing a-Si:H on an industrial scale one mainly uses plasma enhanced chemical vapor deposition (PECVD) of silicon-containing gases or gas mixtures. One thereby deposits p-type, intrinsic, i.e. undoped, and n-type layers of amorphous silicon or amorphous silicon mixed semiconductors one on the other in this order on a transparent substrate with a transparent conductive electrode applied thereto (p-i-n cell). For depositing device-grade a-Si:H, however, the deposition rate in the PECVD method must be limited to values of about 1 Å/s in the large-area industrial process. Although one can in principle attain relatively high rates by high plasma excitation frequencies, high plasma powers or high silane partial pressures, in particular on small areas, the attainable deposition rate for uniformly homogeneous layers decreases as the substrate area increases. Additionally, an increased deposition rate in large-area deposition involves plasma polymerization in the vapor phase, which leads to undesirable, efficiency-reducing powder formation.

A clear increase in deposition rate has been achieved by the so-called "hot wire" (HW) method known from the literature, which deposits the intrinsic layer of a-Si:H using a heated wire which is fed silane for thermal decomposition (U.S. Pat. No. 5,397,737; J. Appl. Phys. 82(4)(1997)1909). A deposition rate of 5–10 Å/s is reached.

One uses a tungsten wire which is heated to a high temperature of about 2000°C. during deposition of the a-Si:H layer, while the substrate on which the a-Si:H is deposited is heated to a temperature of at least 330° C. and at most 630° C. However, the high substrate temperature of at least 330° C. is an essential disadvantage of the known method since it considerably increases the energy consumption.

In addition, solar modules with a p-i-n layer sequence on a glass/TCO substrate are already produced industrially (so-called superstrate technology). However, if the amorphous silicon is deposited on the glass/TCO substrate at a substrate temperature of more than 250° C., in particular more than 300° C., a clear drop in the power output of the solar cell will be noticed. This is presumably due to destruction of the p layer by diffusion of metal atoms out of the TCO layer.

SUMMARY OF THE INVENTION

An objective of the invention is to provide a hot wire method for producing a thin-film solar cell of amorphous silicon with an increased deposition rate of the a-Si:H layer at a lower temperature in comparison with the above-mentioned known HW method, with high efficiency and minimal efficiency degradation.

DESCRIPTION OF THE INVENTION

Figure 5:
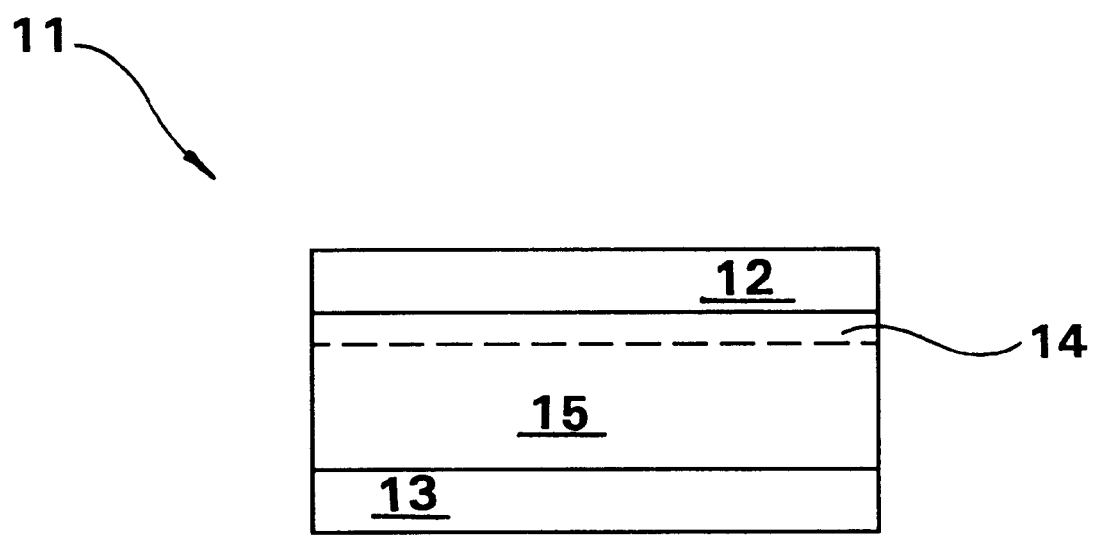
FIG. 5 is a schematic cross sectional view of solar cell of this invention.

As seen by FIG. 5, this invention provides a thin-film solar cell 11 having at least a p-type layer 12, an intrinsic layer of amorphous silicon and an n-type layer 13 (p-i-n structure). The intrinsic layer has an interface with the p-type layer, an intrinsic interlayer 14, with lower hydrogen content and higher density than the remaining, main, intrinsic layer 15.

According to the inventive method, the intrinsic silicon layer 14 and 15 is deposited by the hot wire method at less than 300° C., in particular less than 250° C. and preferably only 200° C. or less. The inventive method thus has the considerable advantage that it can be used directly in the perfected superstrate technology.

The invention is applicable not only to the material a-Si:H but in principle to all silicon-based noncrystalline semiconductors, in particular silicon-based mixed semiconductors with further elements, e.g. germanium or carbon, and to microcrystalline ($\mu c$), nanocrystalline (nc) and finely crystalline semiconductors.

The invention additionally permits a higher deposition rate than in the PECVD method.

An essential aspect of the invention is that the deposition rate is controlled via the wire temperature, i.e. the hotter the wire, the higher the deposition rate. The wire temperature alters not only the rate, however, but also the process gas decomposition and therefore the growth process of the layer. This has a considerable influence on the layer properties and must be taken into account in the production of the a-Si:H solar cell. According to the invention a first intrinsic layer is initially deposited on a p-type layer (p-i interlayer 14) at a low wire temperature, i.e. a slower rate. Then the wire temperature is increased and a second intrinsic layer 15 (main layer) deposited on the first intrinsic layer at a clearly increased rate.

The temperature of the wire is preferably at most 1600° C., in particular less than 1500° C., in the initial phase for depositing the intrinsic interlayer on the p-type layer, while being increased to more than 1500° C., in particular 1600° C. or more, after the initial phase. A tantalum wire has proven especially suitable for the inventive method. Tungsten wires become useless after only a short service life because of strong silicide formation at these relatively low wire temperatures.

The deposition rate in the initial phase for forming the intrinsic interlayer is less than 2.5 Å/s, preferably less than 2 Å/s, in particular about 1 Å/s or even less. After formation of the intrinsic interlayer, the deposition rate can be approximately doubled, e.g. to 2,4 or 5 Å/s and more.

It should be noted that the rate can also be controlled by other process parameters (see below).

A further aspect of the invention is that the initial slow growth on the p-type-intrinsic interface, the p-i junction, forms an interlayer of especially dense, hydrogen-poor intrinsic amorphous silicon. This very good initial layer quality has a positive effect on the solar cell efficiency, on the one hand, and promotes favorable layer growth during further deposition of the solar cell, on the other hand, even when the deposition rate is then increased for forming the (main) intrinsic layer.

The first intrinsic interlayer formed in the initial phase of deposition on the p-i junction should have a layer thickness of at least 5 nm, preferably more than 10 nm and in particular about 20 nm. An essentially thicker first layer causes a reduction of the mean deposition rate for the overall i layer without essentially improving the quality of the solar cell. That is, the thickness of the intrinsic interlayer should be at most 20%, preferably at most 10%, in particular about 5%, of the overall thickness of the intrinsic layer.

The intrinsic interlayer has a hydrogen content of less than 15 at %, preferably less than 10 at %, in particular less than 5 at %.

The partial pressure of the silicon hydride gas used, preferably silane, during deposition of the intrinsic amorphous silicon layer is preferably less than 20 millitorr, in particular less than 10 millitorr. The distance of the heated wire from the substrate can be between 2 and 8 cm, in particular about 5 cm.

The inventive method can be used in particular for producing amorphous silicon thin-film solar cells having the layer sequence, p-type, intrinsic (i) and n-type (i.e. p-i-n). The inventive method can be used not only for single p-i-n cells but also for tandem or stacked cells having the double layer sequence p-i-n/p-i-n, or triple cells (triple layer sequence p-i-n/p-i-n/p-i-n). The reverse layer sequences (inverse structure(s)) n-i-p, n-i-p/n-i-p or n-i-p/n-i-p/n-i-p are also possible.

The p- or n-type layer is generally doped by incorporating e.g. boron or phosphorus atoms during chemical vapor deposition by admixing doping gases to the process gas. That is, to silane one admixes for example the doping gases diborane ($B_2H_6$) or trimethylboron ($B(CH_3)_3$) for p-type doping or phosphine ($PH_3$) for n-type doping.

The p and n layers can be produced by any method, for example by PECVD, sputtering or the hot wire method.

It is possible to apply the p-i-n layer sequence discontinuously, i.e. for example to take the substrate out of the deposition reactor after deposition of the p-type layer thereon and put it in a hot wire reactor. However, it is preferable to deposit all layers one after the other in the same reactor continuously, at least without breaking the vacuum, i.e. to take the solar cell out of the reactor only after the layer sequence is completely deposited. The reactor can also be a multichamber reactor, the layers of different conductivity types being each deposited in one chamber.

The substrate used for the solar cell is in particular glass provided with a transparent contact layer of an electroconductive metal oxide (transparent conductive oxide or TCO), for example of zinc oxide or stannic oxide, on which the layer sequence p-i-n is deposited singly or several times.

The following presentation of conducted experiments will serve to explain the invention further.

Figure 1:
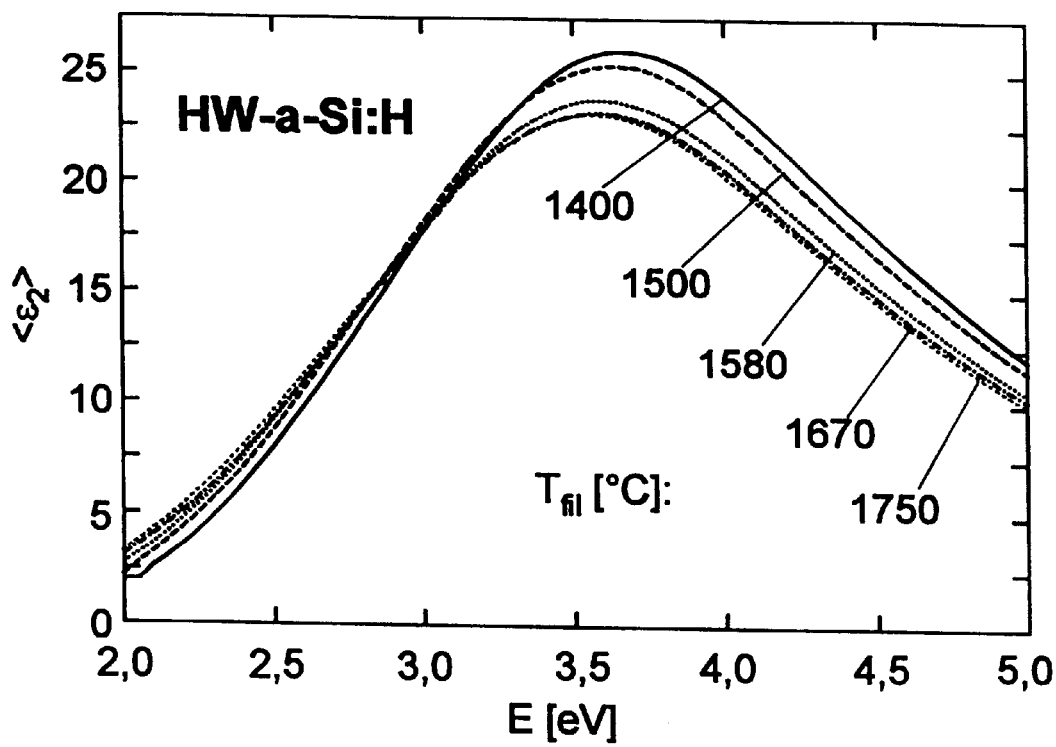
FIG. 1 is a graphical depiction of the relationship between dielectric function as function of irradiated photon energy for hot wire materials deposited at different filament temperatures.

In the following the results of an investigation (Test Series 1) of layer properties of HW i materials will be shown to indicate the dependence of these layer properties on filament temperature $T_{fil}$. For the investigation $T_{fil}$ was varied systematically. Under otherwise identical deposition conditions the i layers were deposited on c-Si substrates at $T_{fil}$=1400° C., 1500° C., 1580° C., 1670° C. and 1750° C. FIG. 1 shows in-situ determined spectroscopic ellipsometric data, specifically the imaginary part of the dielectric function $<\epsilon_2>$as a function of the irradiated photon energy E for different $T_{fil}$. The measurements were done following R. W. Collins in "Amorphous Silicon and Related Materials" (ed. H. Fritzsche), World Scientific (Singapore 1988), pp. 1003–1044. In a first approximation, the maximum value of $<\epsilon_2>$can be correlated with the density of the layer. Every deviation of the $\epsilon_2$=f(E) maximum to lower energies than 3.6 eV indicates an increase in surface roughness. As FIG. 1 shows, the layers deposited at high $T_{fil}$ have a microstructure with low density and high surface roughness. The layers deposited at low $T_{fil}$ are by contrast very compact (high density) and have a relatively smooth surface. Additionally conducted investigations show a correlation of layer density with electronic quality of the material. A criterion for suitability of a material for use in semiconductor devices, in particular solar cells, is the mobility of the minority carriers which is characterized by the ambipolar diffusion length $L_{amb}$. Our measurements yielded a value of only $L_{amb}$=90 nm for the layers with $T_{fil}$=1750° C., but a value $L_{amb}$>200 nm at $T_{fil}$=1500° C. If a HW a-Si:H material with this favorable microstructure and excellent electronic quality is used as an interlayer between p and i layers, the interface defect density at the p-i junction is essentially and crucially reduced. The structural and electronic properties of the main i layer deposited on this interface layer are likewise improved, but seem less critical.

Various investigations on a-Si:H layers and a-Si:H layer systems have shown that hydrogen incorporation and in particular hydrogen content are of crucial importance for their density as well as their electronic properties. Therefore H concentration depth profiles were determined for different HW a-Si:H layer sequences (Test Series 2). For this purpose a HW a-Si:H layer was first deposited on a c-Si substrate bearing a p a-SiC:H layer. The temperature $T_{fil}$ of the tantalum wire was 1600° C. throughout the deposition process. The experiment was repeated but with $T_{fil}$ first being 1400° C. at the beginning of deposition and increased to 1600° C. only after deposition of this intrinsic interlayer. The described layer structures were examined by secondary ion mass spectrometry (SIMS).

The MCs+ technique was thereby used (J.Vac.Sci.Technol. A12(1994)452), the sample to be examined being bombarded with cesium (Cs) ions with an energy of 5.5 keV, "M" standing for the ion to be analyzed, i.e. the hydrogen ion (H).

Figure 2:
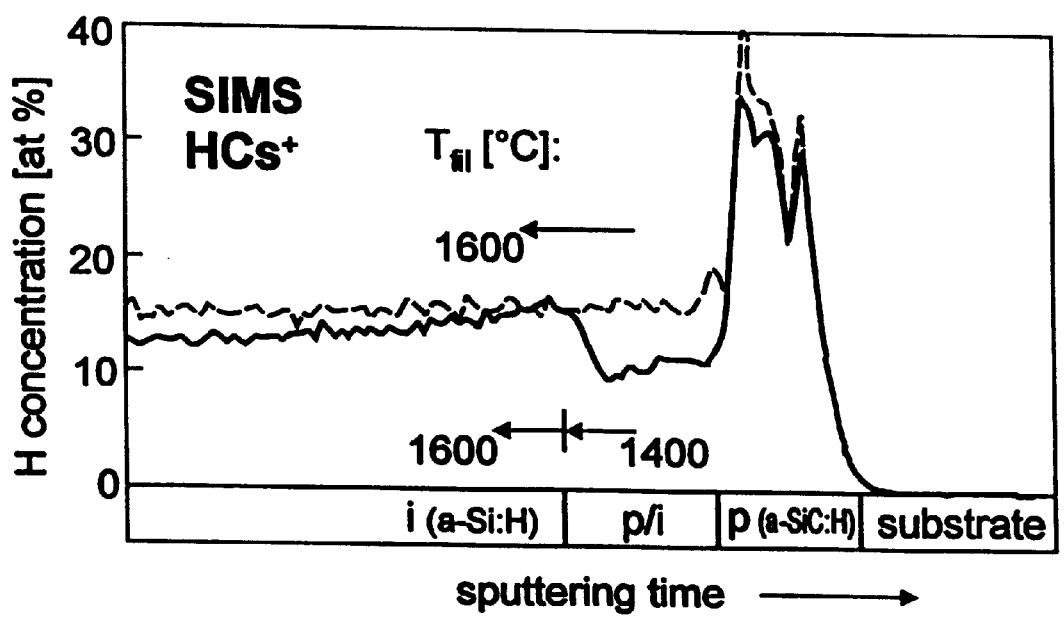
FIG. 2 is a graphical depiction of the hydrogen concentration of the layers of the material forming the solar cell when the material is applied under different filament temperatures.

FIG. 2 shows the H concentration profiles for the two layer structures being compared, the abscissa plotting the sputtering time for material removal, i.e. a quantity proportional to layer thickness. The layer structure deposited at constant $T_{fil}$ has a constant H content of about 15 at % throughout the i layer (dashed line in FIG. 2). In contrast, the comparative structure initially shows for the p-i interlayer ($T_{fil}$=1400° C.) a H concentration of about 10 at % which rises to 15–16 at % ($T_{fil}$=1600° C.) and then drops slightly (continuous line in FIG. 2).

The described results of SIMS depth profile analysis (determination of H concentration) indicate a clear modification of the p-i interlayer upon variation of filament temperature (the high H content of the p layer (>30 at %) being usual for p a-SiC:H material). The decreased H concentration on the p-i interface at decreased $T_{fil}$—like the results of the ellipsometric test series—means that an especially compact (dense) a-Si:H layer grows. This high material density on the interface leads to a network with a small number of interface defects. This clearly reduces the recombination losses of the charge carriers on this interface.

The HW a-Si:H solar cells were prepared in the following way.

A p-type amorphous silicon carbon layer (a-SiC:H) with a layer thickness of about 9 nm was applied to the TCO layer on a glass substrate using PECVD. To form the about 500 nm thick i layer, the glass/TCO substrate bearing the p layer was put in a UHV deposition reactor provided with a heatable wire. The heatable wire used was a W-shaped tantalum filament with a wire diameter of 0.5 mm. The distance of the substrate from the wire was 5 cm.

The reactor was evacuated, the temperature of the substrate ($T_s$) adjusted to about 200° C. The gas flow of silane was 20 sccm.

Intrinsic amorphous silicon was deposited on the p layer over an area of 5 cm×5 cm.

After formation of the intrinsic layer, the hot wire deposition was interrupted and the glass/TCO substrate with the p and i layers put, after cooling, in a sputtering chamber where a 25 nm thick n-type amorphous silicon layer was sputtered on the i layer.

An aluminum film was evaporated on the n layer as a rear contact.

Table 1 below shows some examples of a-Si:H solar cells whose i layer was produced by the inventive HW method. During production of this solar cell series the parameter, wire temperature (filament temperature $T_{fil}$) of the tantalum wire, was varied, during deposition of both the p-i interlayer and the i main layer (Test Series 3). The parameter, process gas pressure (not shown here), likewise has a considerable influence on the solar cell properties. The quality feature of the cells is efficiency η0 measured after deposition.

TABLE 1

| Test Series 3 | $T_{fil}$ [° C.] p-i interlayer | $T_{fil}$ [° C.] i layer | $\eta_0$ [%] |
| --- | --- | --- | --- |
| 1 | 1650 | 1650 | 2.4 |
| 2 | 1450 | 1620 | 8.4 |
| 3 | 1450 | 1500 | 9.7 |

Test Series 3 (Examples 1–3) clearly shows that the decrease of $T_{fil}$ during deposition of the p-i interlayer leads to a clear increase in efficiency. That means it is necessary to clearly lower the rate for depositing high-quality HW a-Si:H solar cells, at least at the beginning of the deposition.

As mentioned above, however, a deposition method for a-Si:H solar cells is only of interest to users if it attains a throughput in production which promises economical production. For this purpose the deposition rate for the overall layer thickness of the i layer must be increased without impairing the quality of the solar cell. One can increase the deposition rate by either increasing the filament temperature or increasing the silane partial pressure. It is also possible to vary the two parameters simultaneously. A further test series was therefore conducted. The rate for the p-i interlayer was set constant to approximately 1 Å/s. The rate for the main i layer was varied (increased). The results of this Test Series 4 in Table 2 (Examples 4 to 7) show that one can clearly increase the rate for depositing the main i layer and thus the mean rate for depositing the overall i layer without having to accept a strong reduction in efficiency.

TABLE 2

| Test Series 4 | Rate (Main i layer) [Å/s] | Mean rate (Overall i layer) [Å/s] | $\eta_0$ [%] |
| --- | --- | --- | --- |
| 4 | 2 | 1.6 | 9.9[1] |
| 5 | 2.8 | 2.1 | 9.7[1] |
| 6 | 4.0 | 2.4 | 9.2[2] |
| 7 | 8.5 | 4.2 | 8.5[2] |

[1]Produced with antireflection coating
[2]Produced without antireflection coating. However, an antireflection layer was taken into account when determining $\eta_0$ for comparability with Examples 4 and 5.

It is probable that mean rates of 5 Å/s can be obtained for high-quality HW a-Si:H solar cells of the described inventive design by optimizing the deposition parameters.

Considerations on Stability

One problem of a-Si:H-PV technology is the impairment of layer properties by the formation of metastable defects upon incidence of light and the accompanying cell degradation (Staebler-Wronski effect). Since defect production through incidence of light is self-limiting, one can describe the degradation process as stabilization Endeavors to obtain a-Si:H material with higher stability (lower susceptibility to light aging) resulted in the works (U.S. Pat. No. 5,397,737; J. Appl. Phys. 82 (4) (1997) 1909) on HW a-Si:H material introduced above. They showed that a-Si:H layers produced at high substrate temperatures ($T_s$= 330° C. to 630° C.) have a H content of ≈1–2 at % and are clearly more stable under light irradiation than conventional layers produced by the PECVD method. Since the deposition temperature is usually 200–300° C. in the PECVD process, thus prepared a-Si:H layers contain≈12–15 at % hydrogen.

Modifications of the PECVD process for a-Si:H solar cells are known—deposition at lower temperature in combination with high H dilution of silane during the deposition of the i layer—which lead to improved stabilizing behavior (Proc. 23$^{rd}$ IEEE PVSC, Louisville, Ky. (1993), p. 790). In contrast, the addition of hydrogen to the silane has achieved no improvements for hitherto known HW layers (see above-mentioned source in J. Appl. Phys. 82(4)).

Figure 3:
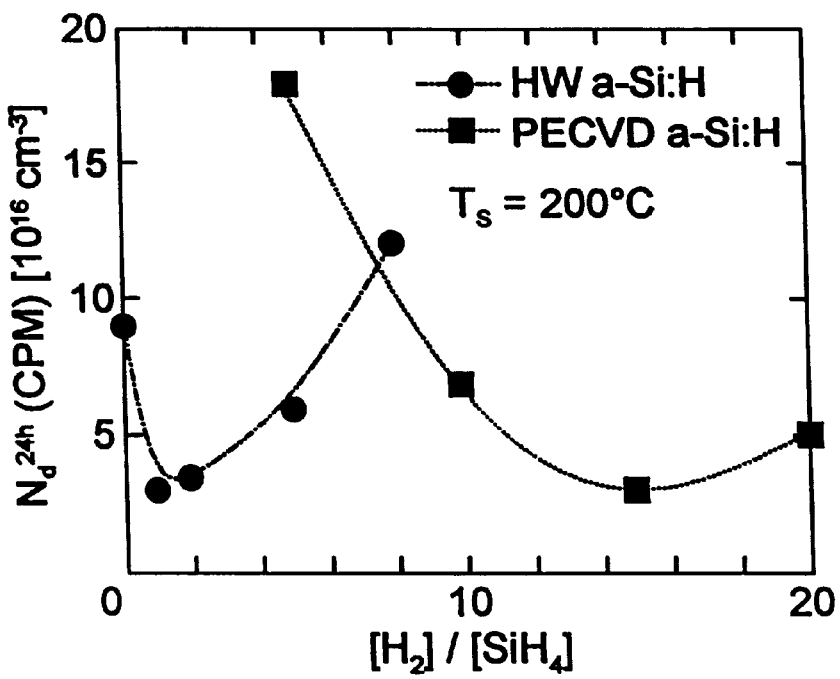
FIG. 3 is a graphical representation of the defect density as a function of the hydrogen dilution ratio.

In a comparative investigation on HW and PECVD a-Si layers (Test Series 5) the influence of H dilution on electronic properties was tested. Substrate temperature for all samples is $T_s$=200° C. $T_{fil}$ for HW samples is 1500° C. FIG. 3 plots the defect density (after 24 hours of flashlight aging) determined by CPM (constant photo-current method) as a function of the H dilution ratio $[H_2]$:$[SiH_4]$. The PECVD layers show a pronounced minimum at a dilution ratio of about 15:1. For preparation with the hot wire process, however, one obtains maximum layer stability at a much lower dilution of about 1:1. This shows that the different methods deposit layers having different microstructures which result in the different properties and behavior observed.

According to the invention the silane is thus preferably diluted with hydrogen, at a volume ratio of preferably 1:0.2 to 1:5, in particular 1:0.5 to 1:2.

While a-Si:H depositions were done on the laboratory scale in the above experiments, it is necessary for practical application to upscale the technology to larger areas in the m$^2$ range.

This can be realized in a deposition reactor designed for large areas whose evacuable chamber contains a lattice disposed plane-parallel to the substrate holder and consisting of a frame preferably of ceramic material on which a tantalum wire is mounted in a meander shape.

Figure 4:
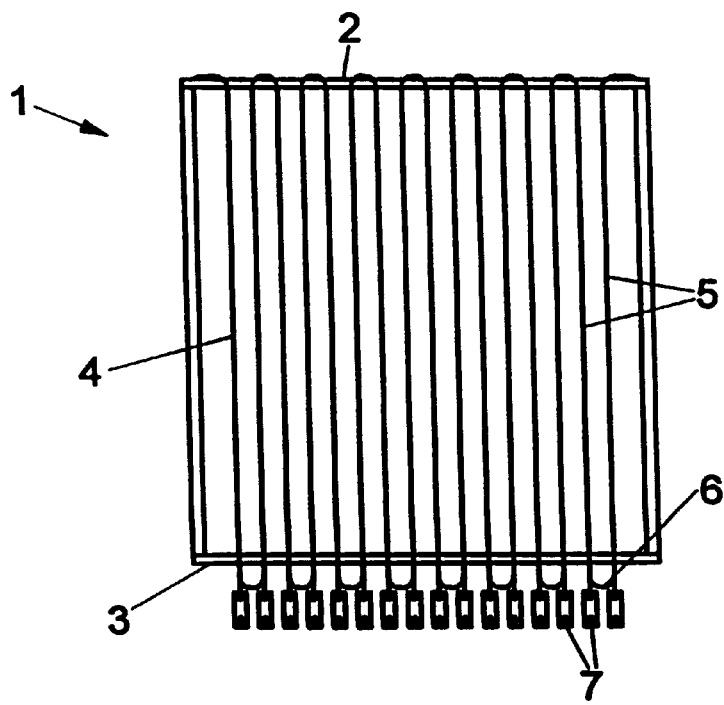
FIG. 4 depicts the lattice assembly to which a tantalum wire may be suspended in order to facilitate the hot wire deposition of the amorphous silicon.

FIG. 4 shows a special embodiment of such a lattice.

The lattice has rectangular frame 1 of a heatproof ceramic material (Marcor®). Tantalum wire 4 is mounted in a meander shape over opposite long sides 2, 3 of the frame, resulting in parallel, equally spaced wire portions 5 interconnected by portions 6 extending around longitudinal rods 2, 3.

Weights 7 hang on connecting portions 6 of tantalum wire 4 so that wire 4 is always optimally tensed and thermal extension cannot have an adverse effect on filament geometry and thus deposition homogeneity. This is important since it results in better reproducible wire geometry which is not dependent on the thermal history of wire 4.

Unlike the PECVD deposition method, the HW deposition method involves no problem in transferring the high deposition rates from the laboratory area to a large area and maintaining or increasing them.

We claim:

1. A thin-film solar cell including: a p-type layer; an n-type layer; and an intrinsic layer consisting of amorphous silicon and hydrogen that is located between said p-type layer and said n-type layer wherein, said intrinsic layer includes a main layer adjacent said n-type layer that has a first hydrogen content and an interlayer located between said main layer and said p-type layer that has a second hydrogen content that is less than the first hydrogen content.

2. The solar cell of claim 1, wherein the intrinsic layer main layer has a hydrogen content that is at least 30% greater than the hydrogen content of the intrinsic layer interlayer.

3. The solar cell of claim 2, wherein the intrinsic interlayer has a thickness of at least 5 nm and less than 50 nm.

4. The thin-film solar cell of claim 1, wherein the intrinsic interlayer has a layer thickness of at least 5 nm and less than 50 nm.

5. The solar cell of claim 1, wherein the hydrogen concentration of said intrinsic layer increases at least 30% across a transition from the intrinsic interlayer to the main layer.

6. The solar cell of claim 5, wherein said intrinsic layer has a density and the density of the intrinsic interlayer is greater than the density of the intrinsic main layer.

7. The solar cell of claim 1, wherein said intrinsic layer has a density and the density of the intrinsic interlayer is greater than the density of the intrinsic main layer.

* * * * *